United States Patent
Kim et al.

(10) Patent No.: US 9,014,296 B2
(45) Date of Patent: Apr. 21, 2015

(54) METHOD AND APPARATUS FOR TRANSMITTING ENCODED SIGNALS WITH FREQUENCY HOPPING ENVIRONMENT

(75) Inventors: Min Gyu Kim, Anyang-si (KR); Dae Won Lee, Anyang-si (KR); Dong Wook Roh, Anyang-si (KR); Joon Kui Ahn, Anyang-si (KR); Suck Chel Yang, Anyang-si (KR); Ki Jun Kim, Anyang-si (KR); Dong Youn Seo, Anyang-si (KR)

(73) Assignee: LG Electronics Inc., Seoul (KR)

( * ) Notice: Subject to any disclaimer, the term of this patent is extended or adjusted under 35 U.S.C. 154(b) by 474 days.

(21) Appl. No.: 13/377,456

(22) PCT Filed: Sep. 30, 2010

(86) PCT No.: PCT/KR2010/006663
§ 371 (c)(1),
(2), (4) Date: Dec. 9, 2011

(87) PCT Pub. No.: WO2011/043554
PCT Pub. Date: Apr. 14, 2011

(65) Prior Publication Data
US 2012/0093197 A1    Apr. 19, 2012

Related U.S. Application Data

(60) Provisional application No. 61/250,008, filed on Oct. 9, 2009, provisional application No. 61/355,540, filed on Jun. 16, 2010.

(51) Int. Cl.
| | |
|---|---|
| *H04L 27/00* | (2006.01) |
| *H04L 5/00* | (2006.01) |
| *H03M 13/27* | (2006.01) |
| *H03M 13/31* | (2006.01) |
| *H04L 1/00* | (2006.01) |
| *H04L 1/04* | (2006.01) |
| *H03M 13/13* | (2006.01) |

(52) U.S. Cl.
CPC ............. *H04L 5/0053* (2013.01); *H03M 13/13* (2013.01); *H03M 13/275* (2013.01); *H03M 13/31* (2013.01); *H04L 1/0041* (2013.01); *H04L 1/04* (2013.01)

(58) Field of Classification Search
CPC ..... H03M 13/13; H03M 13/05; H03M 13/31; H04L 1/0041; H04L 5/0007; H04L 5/0055; H04L 5/0053; H04L 1/1861; H04L 5/0048; H04L 5/0044; H04L 1/1893; H04L 25/03343; H04L 5/0057; H04W 16/12; H04W 28/16; H04W 72/04; H04B 2201/71632; H04B 7/02; H04B 7/0682
USPC ........... 375/295, 260, 267; 370/310, 328, 329
See application file for complete search history.

(56) References Cited

U.S. PATENT DOCUMENTS

| | | |
|---|---|---|
| 2008/0025267 A1 | 1/2008 | Wei et al. |
| 2008/0049692 A1 | 2/2008 | Bachu et al. |

(Continued)

*Primary Examiner* — Leila Malek
(74) *Attorney, Agent, or Firm* — Birch, Stewart, Kolasch & Birch, LLP

(57) ABSTRACT

This document is related to a wireless communication system, and more particularly to a method and an apparatus for transmitting encoded signals with frequency hopping environment. A method of transmitting signals by a user equipment (UE) comprises: encoding an input signal having a length of (A) bits by using (A) basis sequences having a length of 20 bits to output an encoded signal having a length of 20 bits, wherein (A) is a natural number less than 14; mapping the encoded signal having the length of 20 bits to two different resource regions, wherein the first 10 bits of the encoded signal are mapped to a first resource region, and the second 10 bits of the encoded signal are mapped to a second resource region; and transmitting the resource-mapped signals to a Node B, wherein the encoded signal or the (A) basis sequences are cyclic shifted with a value of (x) before mapping the encoded signal to the two different resource regions, wherein (x) is a natural number less than 20.

14 Claims, 16 Drawing Sheets

(56) References Cited

U.S. PATENT DOCUMENTS

| | | | |
|---|---|---|---|
| 2008/0075184 A1* | 3/2008 | Muharemovic et al. | 375/260 |
| 2009/0067391 A1* | 3/2009 | Shen et al. | 370/336 |
| 2009/0209264 A1 | 8/2009 | Yang et al. | |
| 2009/0232070 A1 | 9/2009 | Muharemovic et al. | |
| 2009/0245212 A1* | 10/2009 | Sambhwani et al. | 370/336 |
| 2010/0070737 A1* | 3/2010 | Stirling et al. | 711/217 |

\* cited by examiner

Prior Art

Prior Art

Prior Art

Prior Art

METHOD AND APPARATUS FOR TRANSMITTING ENCODED SIGNALS WITH FREQUENCY HOPPING ENVIRONMENT

This application is the National Phase of PCT/KR2010/006663 filed on Sep. 30, 2010, which claims priority under 35U.S.C. 119(e) to U.S. Provisional Application Nos. 61/250,008 and 61/355,540 filed on Oct. 9, 2009 and Jun. 16, 2010, all of which are hereby expressly incorporated by reference into the present application.

FIELD OF THE INVENTION

This document is related to a wireless communication system, and more particularly to a method and an apparatus for transmitting encoded signals with frequency hopping environment.

RELATED ART

Techniques, apparatus and systems described herein can be used in various wireless access technologies such as code division multiple access (CDMA), frequency division multiple access (FDMA), time division multiple access (TDMA), orthogonal frequency division multiple access (OFDMA), single carrier frequency division multiple access (SC-FDMA), etc. The CDMA may be implemented with a radio technology such as Universal Terrestrial Radio Access (UTRA) or CDMA2000. The TDMA may be implemented with a radio technology such as Global System for Mobile communications (GSM)/General Packet Radio Service (GPRS)/Enhanced Data Rates for GSM Evolution (EDGE). The OFDMA may be implemented with a radio technology such as institute of electrical and electronics engineers (IEEE) 802.11 (Wi-Fi), IEEE 802.16 (WiMAX), IEEE 802-20, evolved-UTRA (E-UTRA) etc. The UTRA is a part of a universal mobile telecommunication system (UMTS). 3rd generation partnership project (3GPP) long term evolution (LTE) is a part of an evolved-UMTS (E-UMTS) using the E-UTRA. The 3GPP LTE employs the OFDMA in downlink and employs the SC-FDMA in uplink [1]. LTE-advanced (LTE-A) is an evolution of the 3GPP LTE. For clarity, this application focuses on the 3GPP LTE/LTE-A. However, technical features of the present invention are not limited thereto.

FIG. 1 shows a radio frame structure for 3GPP LTE.

In FIG. 1, a radio frame includes 10 subframes. A subframe includes two slots in time domain. A time for transmitting one subframe is defined as a transmission time interval (TTI). For example, one subframe may have a length of 1 millisecond (ms), and one slot may have a length of 0.5 ms. One slot includes a plurality of orthogonal frequency division multiplexing (OFDM) symbols in time domain. Since the 3GPP LTE uses the OFDMA in the downlink, the OFDM symbol is for representing one symbol period. The OFDM symbol may also be referred to as an SC-FDMA symbol or a symbol period. A resource block (RB) is a resource allocation unit, and includes a plurality of contiguous subcarriers in one slot. The structure of the radio frame is shown for exemplary purposes only. Thus, the number of subframes included in the radio frame or the number of slots included in the subframe or the number of OFDM symbols included in the slot may be modified in various manners.

FIG. 2 shows an exemplary structure of uplink subframe.

In FIG. 2, an uplink subframe can be divided in a frequency domain into a control region and a data region. The control region is allocated with a physical uplink control channel (PUCCH) for carrying uplink control information. The data region is allocated with a physical uplink shared channel (PUSCH) for carrying user data. To maintain a single carrier property, one UE does not simultaneously transmit the PUCCH and the PUSCH. The PUCCH for one UE is allocated to an RB pair in a subframe. RBs belonging to the RB pair occupy different subcarriers in respective two slots. This is called that the RB pair allocated to the PUCCH is frequency-hopped in a slot boundary.

FIG. 3 shows a generic system structure for SC-FDMA and OFDMA.

In a general multi-Input multi-output (MIMO) antenna system based on OFDM (Orthogonal Frequency Division Multiplexing) or SC-FDMA (Single Carrier-Frequency Division Multiple Access), the data signal goes through complex mapping relations within a transmission symbol. First the data to be transmitted are separated into codewords. For most applications codeword will be equivalent to a transport block given by the MAC (Medium Access Control) layer. Each codeword is encoded separately using a channel coder such as Turbo Code or Tail biting convolutional code. After encoding and rate matched to appropriate sizes, and then mapped to 'layers'. For SC-FDMA transmission DFT (Discrete Fourier Transform) precoding is done to each layer, and for OFDM transmission no DFT transform is applied as shown in FIG. 3. Then DFT transformed signal in each layer is multiplied by the precoding vector/matrix and mapped to transmission antenna ports. Note that the transmission antenna ports can be one again mapped to actually physical antennas by mean of antenna virtualization.

FIG. 4 shows uplink SC-FDMA system structure in Rel-8 LTE, and FIG. 5 shows uplink SC-FDMA transmission frame structure for Rel-8 LTE.

In general cubic metric (CM) of single carrier signal (such as SC-FDMA transmission signals) is much lower than multi carrier signals. This general concept is the same for peak power to average power ratios (PAPR) also. Both CM and PAPR are related to the dynamic range which the power amplifier (PA) of the transmitter must support. Under the same PA any transmission signal which has lower CM or PAPR then some other form of signal can be transmitted at a higher transmit power. Reversely if the PA's maximum power is fixed and the transmitter wants to send a high CM or PAPR signal then it must reduce the transmit power slightly more than a low CM signal. The reason why single carrier signal has lower CM than multi-carrier signals is that in multi-carrier signals multiple number of signals are overlapped and sometimes resulting in co-phase addition of signals. This possibility can make large signal amplitude. This is why OFDM system has large PAPR or CM values.

If the resulting signal y only consists of information symbol $x_1$, then this signal can be considered as single carrier signal like $y=x_1$. But if the resulting signal y consists of multiple information symbols $x_1, x_2, x_3, \ldots, x_N$, then the signal can be considered as multi-carrier signal such as $y=x_1+x_2+x_3+\ldots+x_N$. The PAPR or CM is proportional to the number of information symbols coherently added together in the resulting signal waveform, but the values tends to saturate after a certain number of information symbols. So if the resulting signal waveform is created by few additions of single carrier signals, then the CM or PAPR would be much less than multi-carrier signals but slightly higher than a pure single carrier signal.

In Rel-8 LTE system, system structure and transmission frame for the uplink SC-FDMA are adopted as shown in FIGS. 4 and 5. The basic transmission unit is 1 subframe. 2 slots make up 1 subframe, and depending on Cyclic Prefix configuration (e.g. Normal CP or Extended CP) the number of SC-FDMA symbols in a slot is 7 or 6. In each slot there is at least 1 reference signal SC-FDMA symbol, which is not used for data transmission. Within a single SC-FDMA symbol there are multiple subcarriers. A Resource Element (RE) is a complex information symbol mapped to a single subcarrier. In the case DFT transform precoding is used, RE is the single information symbol mapped to a DFT transform index since DFT transform size and the number of subcarriers used in transmission is the same for SC-FDMA.

Hereinafter, uplink transmission of control information using channel coding in LTE-Rel 8 is briefly explained.

In LTE uplink transmission, the certain control channels are encoded utilizing a linear block code. The encoded bits then are mapped to time-frequency resources. When mapping the encoded bits to the time-frequency resources, the encoded bits are divided into two, and the first and the second parts of the encoded bits are mapped to different time-frequency resources to achieve frequency diversity.

The linear block code in LTE-Rel 8 is not designed considering the subsequent time-frequency resource mapping, thus more consideration is needed for the linear block code in view of weight distribution at the subsequent time-frequency resource mapping.

DISCLOSURE

Technical Problem

One aspect of the present invention is for encoding and resource mapping mechanism considering the weight distribution.

Another aspect of the present invention is for providing newly designed basis sequence table for the same purpose.

The object of the present invention is not limited the above stated objects, but includes various objects recited or apparent among the detailed description of the present invention.

Technical Solution

One aspect of the present invention provides a method of transmitting signals by a user equipment (UE), the method comprising: encoding an input signal having a length of (A) bits by using (A) basis sequences having a length of 20 bits to output an encoded signal having a length of 20 bits, wherein (A) is a natural number less than 14; mapping the encoded signal having the length of 20 bits to two different resource regions, wherein the first 10 bits of the encoded signal are mapped to a first resource region, and the second 10 bits of the encoded signal are mapped to a second resource region; and transmitting the resource-mapped signals to a Node B, wherein the encoded signal or the (A) basis sequences are cyclic shifted with a value of (x) before mapping the encoded signal to the two different resource regions, wherein (x) is a natural number less than 20.

When the (A) basis sequences are cyclic shifted with the value of (x) before mapping the encoded signal to the two different resource regions, the input signal is expressed as $(a_n)$, where n=0, 1, ..., A−1, and the n'th basis sequences are expressed as $(M_{i,n})$, where i=0, 1, ..., 19, then the encoded signal, $(b_i)$, can be expressed as:

$$b_i = \left(\sum_{n=0}^{A-1} (a_n \cdot M_{(i+x) \bmod 20, n})\right) \bmod 2,$$

where i=0, 1, ... 19.

The value of (x) cab be predetermined based on the length of (A) bits. More specifically, the value of (x) for A=11 can be predetermined as 2, and the values of (x) for A≠11 can be predetermined among 1~19.

In other example, the value of (x) can be predetermined as 2 regardless of the length of (A) bits.

In one embodiment, the method may further comprises: interleaving the input signal having the length of (A) bits before encoding the input signal. In one example, indexes (n') of the interleaved input signal $(a_{n'})$ can be expressed using indexes (n) of the input signal $(a_n)$ as:

n'=n, for n=0, 1, 2, 3, 4,
n'=n−1, for n=6, 7, 8, ..., 13,
n'=n+8, for n=5.

In another example, indexes (n') of the interleaved input signal $(a_{n'})$ can be expressed using indexes (n) of the input signal $(a_n)$ as:

n'=n, for n=0, 1, 2, 3, 4, 10, 11, 12
n'=n−1, for n=6, 7, 8, 9,
n'=n+4, for n=5.

Another aspect of the present invention provides an user equipment (UE) for transmitting signals, the UE comprising: an encoder configured for encoding an input signal having a length of (A) bits by using (A) basis sequences having a length of 20 bits to output an encoded signal having a length of 20 bits, wherein (A) is a natural number less than 14; a resource mapper configured for mapping the encoded signal having the length of 20 bits to two different resource regions, wherein the first 10 bits of the encoded signal are mapped to a first resource region, and the second 10 bits of the encoded signal are mapped to a second resource region; and a transmitter configured for transmitting the resource-mapped signals to a Node B, wherein the encoded signal or the (A) basis sequences are cyclic shifted with a value of (x) at the encoder, wherein (x) is a natural number less than 20.

When the (A) basis sequences are cyclic shifted with the value of (x) at the encoder, and when the input signal is expressed as $(a_n)$, where n=0, 1, ..., A−1, and the n'th basis sequences is expressed as $(M_{i,n})$, where i=0, 1, ..., 19, then the encoded signal, $(b_i)$, can be expressed as:

$$b_i = \left(\sum_{n=0}^{A-1} (a_n \cdot M_{(i+x) \bmod 20, n})\right) \bmod 2,$$

where i=0, 1, ... 19.

The value of (x) can be predetermined based on the length of (A) bits. In one example, the value of (x) for A=11 can be predetermined as 2, and the values of (x) for A≠11 can be predetermined among 1~19. In another example, the value of (x) can be predetermined as 2 regardless of the length of (A) bits.

The encoder can be further configured for interleaving the input signal having the length of (A) bits before encoding the input signal. In one case, indexes (n') of the interleaved input signal $(a_{n'})$ can be expressed using indexes (n) of the input signal $(a_n)$ as:

n'=n, for n=0, 1, 2, 3, 4,
n'=n−1, for n=6, 7, 8, ..., 13,
n'=n+8, for n=5.

In another case, indexes (n') of the interleaved input signal $(a_{n'})$ can be expressed using indexes (n) of the input signal $(a_n)$ as:

n'=n, for n=0, 1, 2, 3, 4, 10, 11, 12
n'=n−1, for n=6, 7, 8, 9,
n'=n+4, for n=5.

In the above embodiments, the (A) basis sequences are selected from 13 basis sequences expressed as:

| I | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0  | 1 | 1 | 0 | 0 | 0 | 0 | 0 | 0 | 0 | 0 | 1 | 1 | 0 |
| 1  | 1 | 1 | 1 | 0 | 0 | 0 | 0 | 0 | 0 | 1 | 1 | 1 | 0 |
| 2  | 1 | 0 | 0 | 1 | 0 | 0 | 1 | 0 | 1 | 1 | 1 | 1 | 1 |
| 3  | 1 | 0 | 1 | 1 | 0 | 0 | 0 | 0 | 1 | 0 | 1 | 1 | 1 |
| 4  | 1 | 1 | 1 | 1 | 0 | 0 | 1 | 0 | 0 | 1 | 1 | 1 | 1 |
| 5  | 1 | 1 | 0 | 0 | 1 | 0 | 1 | 1 | 1 | 0 | 1 | 1 | 1 |
| 6  | 1 | 0 | 1 | 0 | 1 | 0 | 1 | 0 | 1 | 1 | 1 | 1 | 1 |
| 7  | 1 | 0 | 0 | 1 | 1 | 0 | 0 | 1 | 1 | 0 | 1 | 1 | 1 |
| 8  | 1 | 1 | 0 | 1 | 1 | 0 | 0 | 1 | 0 | 1 | 1 | 1 | 1 |
| 9  | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 0 | 0 | 0 | 0 | 0 | 0 |
| 19 | 1 | 0 | 0 | 0 | 0 | 1 | 1 | 0 | 0 | 0 | 0 | 0 | 0 |

However, the above embodiments can be differently implemented by using newly designed basis sequence table as explained below.

Advantageous Effect

According to one aspect of the present invention, effective encoding and resource mapping mechanism considering the weight distribution is provided.

Various effects, not explicitly recited in this section, can be achieved by the present invention according to the following description.

DESCRIPTION OF DRAWINGS

The accompanying drawings, which are included to provide a further understanding of the invention, illustrate embodiments of the invention and together with the description serve to explain the principle of the invention.

In the drawings.

MODE FOR INVENTION

Reference will now be made in detail to the embodiments of the present invention, examples of which are illustrated in the accompanying drawings. Wherever possible, the same reference numbers will be used throughout the drawings to refer to the same or like parts.

Prior to describing the present invention, it should be noted that most terms disclosed in the present invention correspond to general terms well known in the art, but some terms have been selected by the applicant as necessary and will hereinafter be disclosed in the following description of the present invention. Therefore, it is preferable that the terms defined by the applicant be understood on the basis of their meanings in the present invention.

For the convenience of description and better understanding of the present invention, general structures and devices well known in the art will be omitted or be denoted by a block diagram or a flow chart.

Uplink transmission of control information using channel coding in LTE-Rel 8 is more specifically explained.

In LTE uplink transmission, the certain control channels (for example, CQI transmitted via PUCCH (Physical Uplink Control Channel)) are encoded utilizing a linear block code (as shown in Table 1). If input bits to the linear block code is denoted as $a_0, a_1, a_2, \ldots, a_A$, after encoding the bits, the encoded bits are denoted by $b_0, b_1, b_2, \ldots, b_B$, where B=20 and with the relationship as:

$$b_i = \left(\sum_{n=0}^{A-1} (a_n \cdot M_{i,n})\right) \bmod 2, \quad \text{[Equation 1]}$$

where i=0, 1, 2, ..., B−1.

TABLE 1

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 0 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

Figure 1:
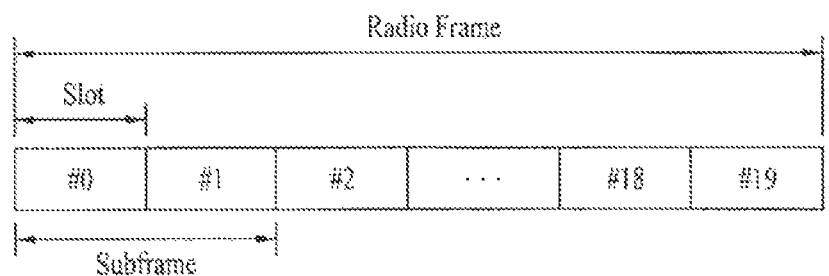
FIG. 1 shows a radio frame structure for 3GPP LTE.
Figure 2:
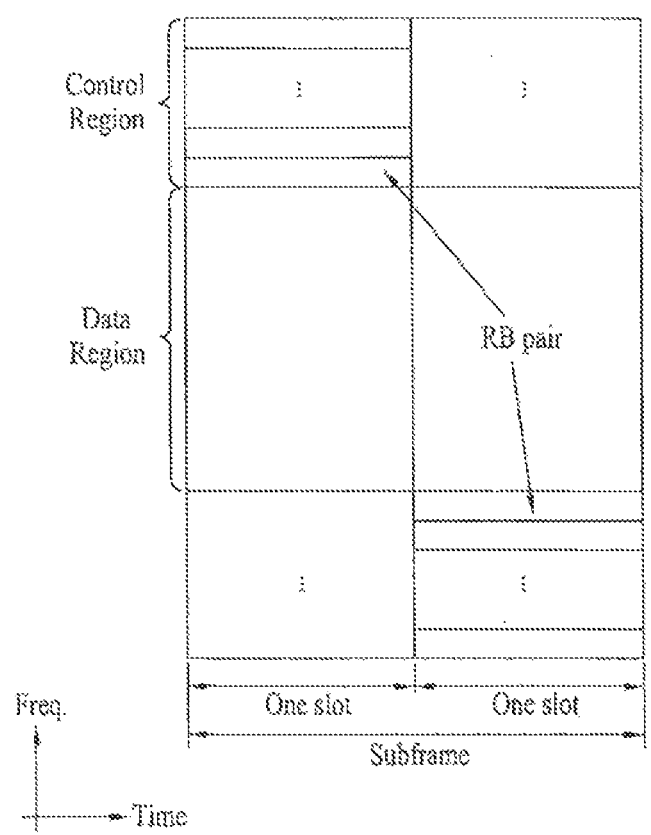
FIG. 2 shows an exemplary structure of uplink subframe.
Figure 3:
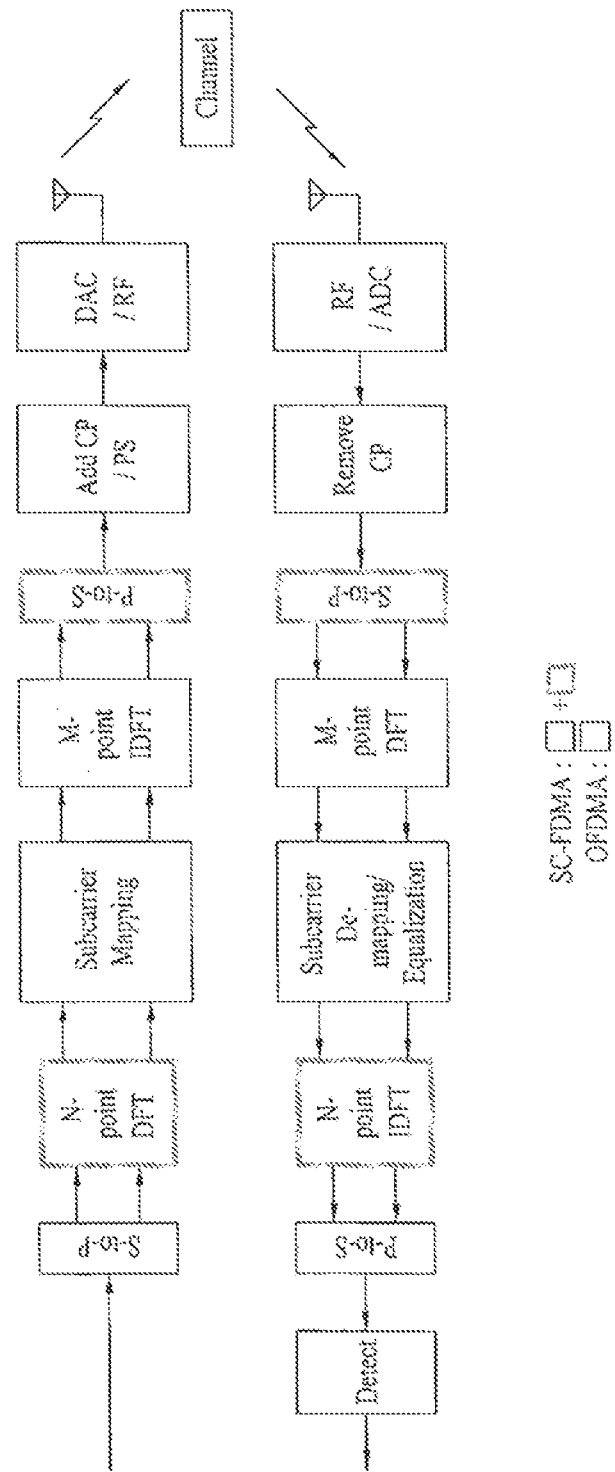
FIG. 3 shows a generic system structure for SC-FDMA and OFDMA.
Figure 4:
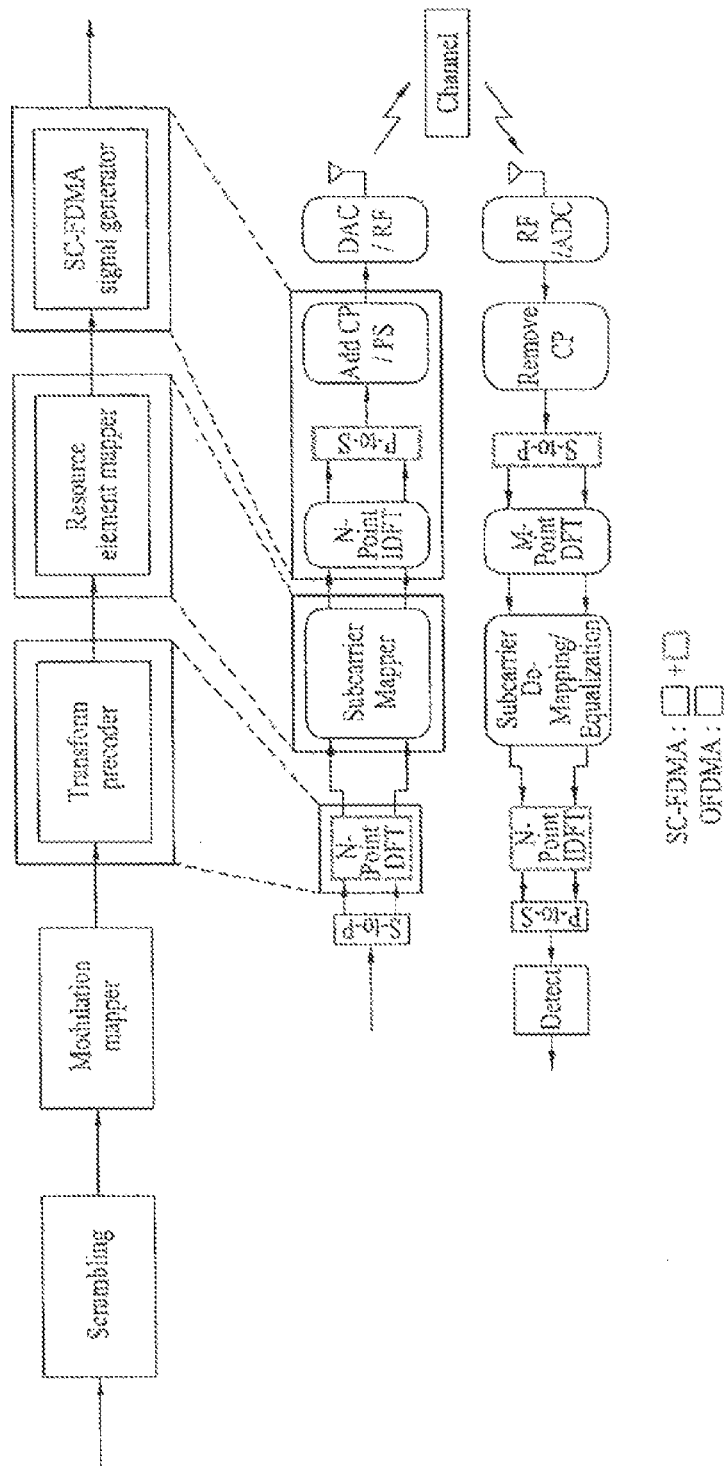
FIG. 4 shows uplink SC-FDMA system structure in Rel-8 LTE.
Figure 5:
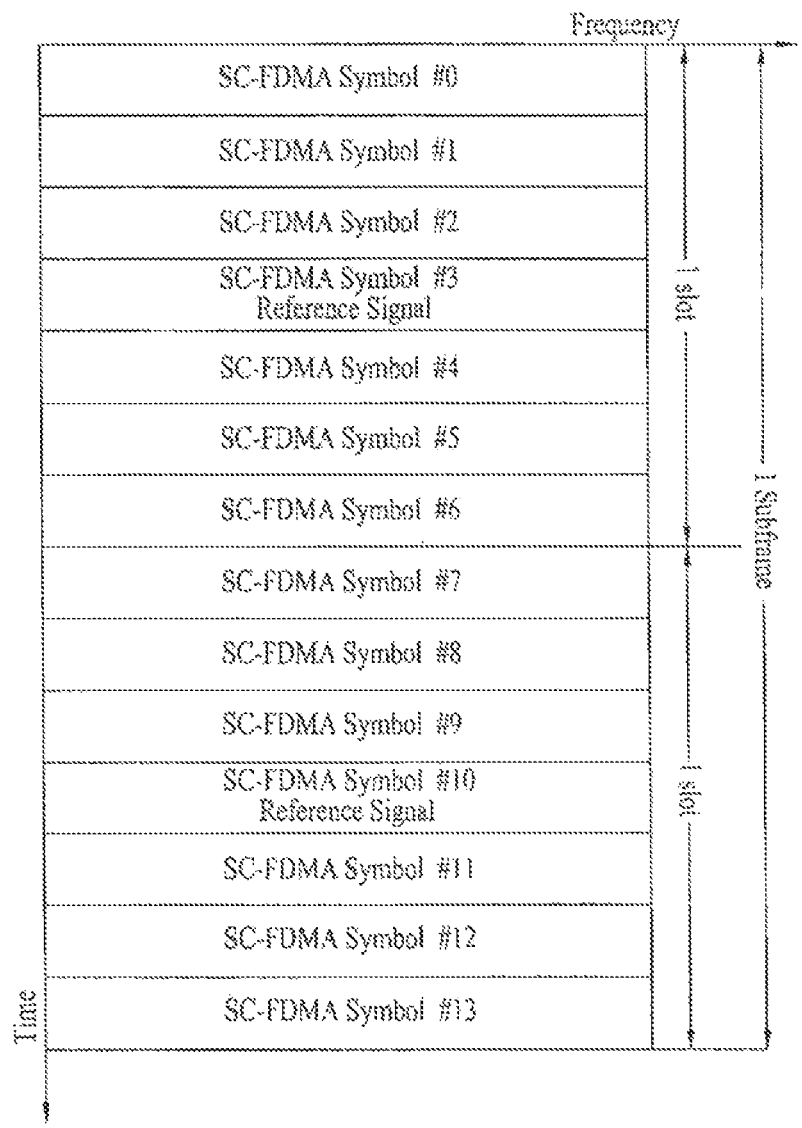
FIG. 5 shows uplink SC-FDMA transmission frame structure for Rel-8 LTE.
Figure 6:
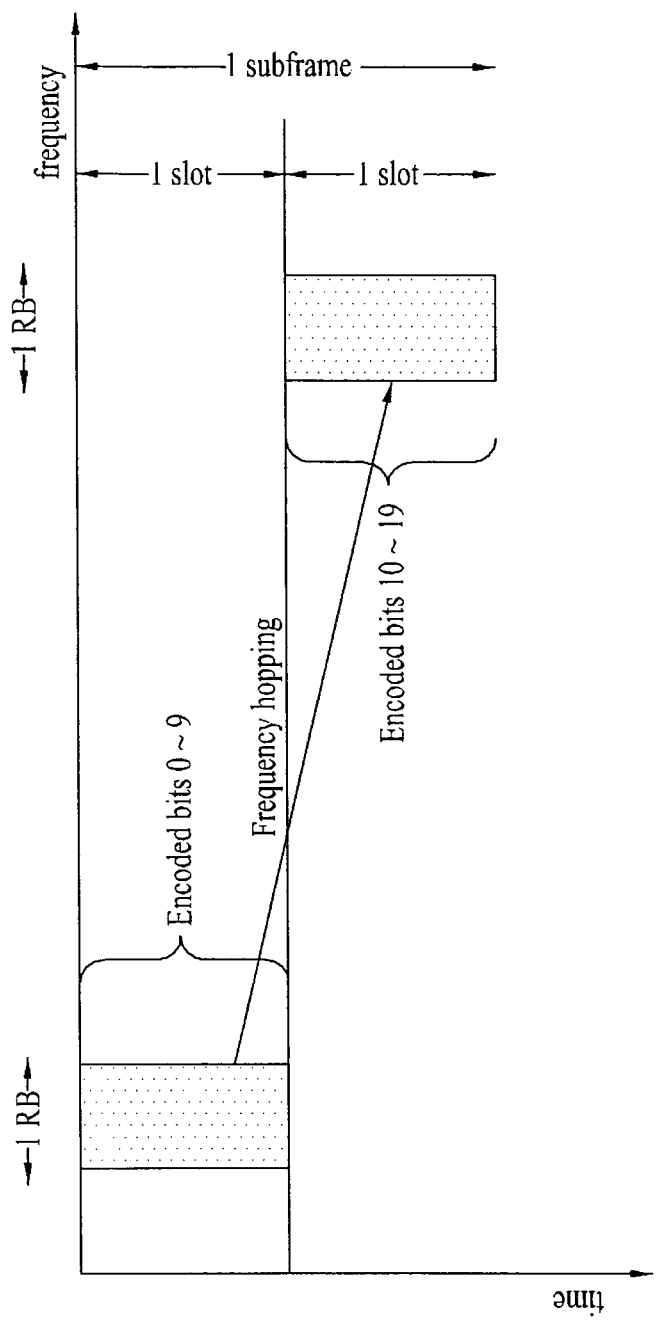
FIG. 6 shows the resource mapping scheme for the encoded bits in LTE Rel-8.

The encoded bits then are mapped to time-frequency resource as shown in FIG. 6.

FIG. 6 shows the resource mapping scheme for the encoded bits in LTE Rel-8.

As shown in FIG. 6, the first 10 encoded bits are mapped a certain time-frequency resource, and the last 10 encoded bits are mapped to a different time-frequency resource, where the frequency separation between first 10 and last 10 encoded bits are usually large. This is to achieve frequency diversity for the encoded bits. As shown in FIG. 6, the two different time-frequency resources located in 2 slots in time domain, and in 2 different frequency regions separated in the frequency domain. Further, codes are multiplied to the encoded bits, thus resource mapping can be referred as mapping to code-time-frequency resource.

The problem with the linear block code as shown in Table 1 is that Mi,5 basis sequence has certain information weight distribution so that the weight is concentrated in one of the slots (half a subframe). This means that in case the slot containing concentrated weight values is affected by frequency null of the wireless channel, the entire information is lost, and this may affect performance.

Figure 7:
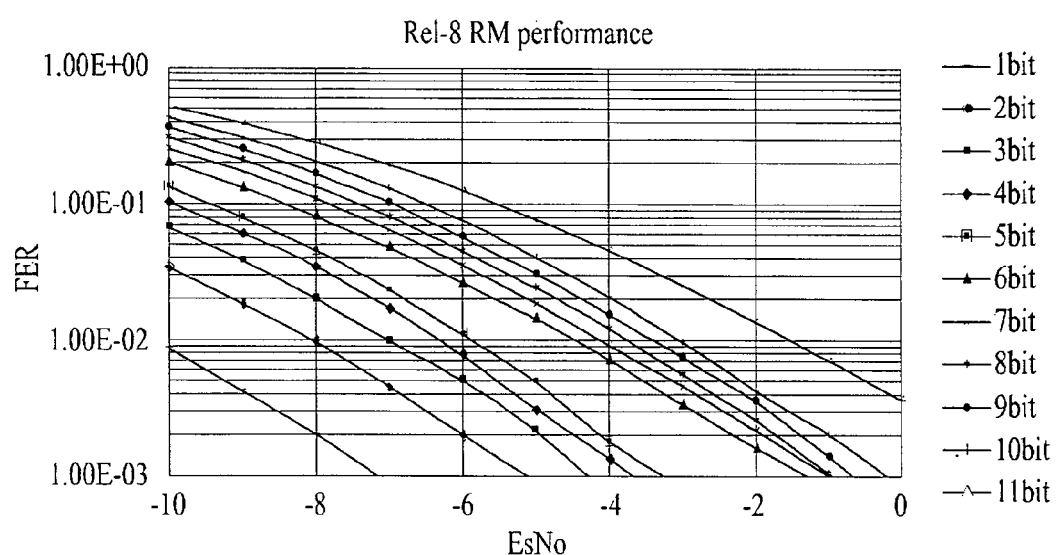
FIG. 7 shows a simulation result showing performance based on the number of input bits to the encoder.

FIG. 7 shows a simulation result showing performance based on the number of input bits to the encoder.

In this simulation, the basis sequence table of table 1 is used, and the actual channel modeling is used. As apparent from the above, Mi,5 of Table 1 is used from when the number of input bits to the encoder exceed 5 bits (starting from 6 bit input). In FIG. 7, the vertical axis indicates the FER (Frame Error Rate) and the horizontal axis indicates EsNo (the ratio of the transmitted energy per channel symbol to the noise spectrum density). Therefore, performance is greater if a curve indicates less FER.

In FIG. 7, the FER curve is shifted upward when the number of input bits increases from 5 bits to 6 bits. As stated above, this is due to the use of Mi,5 of Table 1.

In order to solve this problem, it is beneficial to distribute the weight of the codewords equally in both slots. This can be achieved in two ways. One is to cyclic shift rows of the linear block matrix in Table 1. The cyclic shifted linear block code is shown in Table 2 and Table 3, for examples.

TABLE 2

| Original row index from Table 1 | i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|---|
| 5 | 0 | 1 | 1 | 0 | 0 | 1 | 0 | 1 | 1 | 1 | 0 | 1 | 1 | 1 |
| 6 | 1 | 1 | 0 | 1 | 0 | 1 | 0 | 1 | 0 | 1 | 1 | 1 | 1 | 1 |
| 7 | 2 | 1 | 0 | 0 | 1 | 1 | 0 | 0 | 1 | 1 | 0 | 1 | 1 | 1 |
| 8 | 3 | 1 | 1 | 0 | 1 | 1 | 0 | 0 | 1 | 0 | 1 | 1 | 1 | 1 |
| 9 | 4 | 1 | 0 | 1 | 1 | 1 | 0 | 1 | 0 | 0 | 1 | 1 | 1 | 1 |
| 10 | 5 | 1 | 0 | 1 | 0 | 0 | 1 | 1 | 1 | 0 | 1 | 1 | 1 | 1 |
| 11 | 6 | 1 | 1 | 1 | 0 | 0 | 1 | 1 | 0 | 1 | 0 | 1 | 1 | 1 |
| 12 | 7 | 1 | 0 | 0 | 1 | 0 | 1 | 0 | 1 | 1 | 1 | 1 | 1 | 1 |
| 13 | 8 | 1 | 1 | 0 | 1 | 0 | 1 | 0 | 1 | 0 | 1 | 1 | 1 | 1 |
| 14 | 9 | 1 | 0 | 0 | 0 | 1 | 1 | 0 | 1 | 0 | 0 | 1 | 0 | 1 |
| 15 | 10 | 1 | 1 | 0 | 0 | 1 | 1 | 1 | 1 | 0 | 1 | 0 | 0 | 1 |
| 16 | 11 | 1 | 1 | 1 | 0 | 1 | 1 | 1 | 0 | 0 | 1 | 0 | 1 | 1 |
| 17 | 12 | 1 | 0 | 0 | 1 | 1 | 1 | 0 | 0 | 1 | 0 | 0 | 1 | 1 |
| 18 | 13 | 1 | 1 | 0 | 1 | 1 | 1 | 1 | 1 | 0 | 0 | 0 | 0 | 0 |
| 19 | 14 | 1 | 0 | 0 | 0 | 0 | 1 | 1 | 0 | 0 | 0 | 0 | 0 | 0 |
| 0 | 15 | 1 | 1 | 0 | 0 | 0 | 0 | 0 | 0 | 0 | 0 | 1 | 1 | 0 |
| 1 | 16 | 1 | 1 | 1 | 0 | 0 | 0 | 0 | 0 | 0 | 1 | 1 | 1 | 0 |
| 2 | 17 | 1 | 0 | 0 | 1 | 0 | 0 | 1 | 0 | 1 | 1 | 1 | 1 | 1 |
| 3 | 18 | 1 | 0 | 1 | 1 | 0 | 0 | 0 | 0 | 1 | 0 | 1 | 1 | 1 |
| 4 | 19 | 1 | 1 | 1 | 1 | 0 | 0 | 0 | 1 | 0 | 0 | 1 | 1 | 1 |

TABLE 3

| Original row index from Table 1 | i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|---|
| 15 | 0 | 1 | 1 | 0 | 0 | 1 | 1 | 1 | 1 | 0 | 1 | 1 | 0 | 1 |
| 16 | 1 | 1 | 1 | 1 | 0 | 1 | 1 | 1 | 0 | 0 | 1 | 0 | 1 | 1 |
| 17 | 2 | 1 | 0 | 0 | 1 | 1 | 1 | 0 | 0 | 1 | 0 | 0 | 1 | 1 |
| 18 | 3 | 1 | 1 | 0 | 1 | 1 | 1 | 1 | 1 | 0 | 0 | 0 | 0 | 0 |
| 19 | 4 | 1 | 0 | 0 | 0 | 0 | 1 | 1 | 0 | 0 | 0 | 0 | 0 | 0 |
| 0 | 5 | 1 | 1 | 0 | 0 | 0 | 0 | 0 | 0 | 0 | 0 | 1 | 1 | 0 |
| 1 | 6 | 1 | 1 | 1 | 0 | 0 | 0 | 0 | 0 | 0 | 1 | 1 | 1 | 0 |
| 2 | 7 | 1 | 0 | 0 | 1 | 0 | 0 | 1 | 0 | 1 | 1 | 1 | 1 | 1 |
| 3 | 8 | 1 | 0 | 1 | 1 | 0 | 0 | 0 | 0 | 1 | 0 | 1 | 1 | 1 |
| 4 | 9 | 1 | 1 | 1 | 1 | 0 | 0 | 0 | 1 | 0 | 0 | 1 | 1 | 1 |
| 5 | 10 | 1 | 1 | 0 | 0 | 1 | 0 | 1 | 1 | 1 | 0 | 1 | 1 | 1 |
| 6 | 11 | 1 | 0 | 1 | 0 | 1 | 0 | 1 | 0 | 1 | 1 | 1 | 1 | 1 |
| 7 | 12 | 1 | 0 | 0 | 1 | 1 | 0 | 0 | 1 | 1 | 0 | 1 | 1 | 1 |
| 8 | 13 | 1 | 1 | 0 | 1 | 1 | 0 | 0 | 1 | 0 | 1 | 1 | 1 | 1 |
| 9 | 14 | 1 | 0 | 1 | 1 | 1 | 0 | 1 | 0 | 0 | 1 | 1 | 1 | 1 |
| 10 | 15 | 1 | 0 | 1 | 0 | 0 | 1 | 1 | 1 | 0 | 1 | 1 | 1 | 1 |
| 11 | 16 | 1 | 1 | 1 | 0 | 0 | 1 | 1 | 0 | 1 | 0 | 1 | 1 | 1 |
| 12 | 17 | 1 | 0 | 0 | 1 | 0 | 1 | 0 | 1 | 1 | 1 | 1 | 1 | 1 |
| 13 | 18 | 1 | 1 | 0 | 1 | 0 | 1 | 0 | 1 | 0 | 1 | 1 | 1 | 1 |
| 14 | 19 | 1 | 0 | 0 | 0 | 1 | 1 | 0 | 1 | 0 | 0 | 1 | 0 | 1 |

The rows of the original linear block code matrix (basis sequence table) are cyclic shifted by 5 rows in forward direction and backward direction for Table 2 and Table 3, respectively. We can see that for the first 10 and last 10 encoded bits $M_{i,5}$ now has 5 of '1's and 5 of '0', effectively distributing information weights in each slot.

Alternative method of implementation is having a different encoded bits pattern or different basis sequences to output bits before resource mapping. This can be done by using cyclic shift operation on the encoded bit or the basis sequences. For examples equivalent to the tables 2 and 3, when the basis sequences are cyclic shifted, input bits to the linear block code is denoted as $a_0, a_1, a_2, \ldots, a_A$, encoded bits are denoted by $b_0, b_1, b_2, \ldots, b_b$, where B=20, and $M_{i,n}$ is the linear block matrix element in Table 1, then the encoded bits can be expressed as:

$$b_i = \left( \sum_{n=0}^{A-1} (a_n \cdot M_{(i+5) mod B, n}) \right) mod 2, \quad \text{[Equation 2]}$$

where i=0, 1, 2, . . . , B−1.

$$b_i = \left( \sum_{n=0}^{A-1} (a_n \cdot M_{(i+15) mod B, n}) \right) mod 2, \quad \text{[Equation 3]}$$

where i=0, 1, 2, . . . , B−1.

As apparent for those skilled in the art, equations 2 and 3 are equivalent to schemes using tables 2 and 3, respectively.

The cyclic shift values of '5' or '15' of tables 2 and 3 (equations 2 and 3) are only exemplary. To generalize this embodiment for the case when B=20, we propose applying cyclic shift to the basis sequence with a value of 'x', then the encoded bits, bi, can be expressed as:

$$b_i = \left( \sum_{n=0}^{A-1} (a_n \cdot M_{(i+x) mod 20, n}) \right) mod 2, \quad \text{[Equation 4]}$$

where i=0, 1, . . . 19.

In one embodiment of the present invention propose to apply optimized cyclic shift value to the encoded bits or bases sequences. The following explanation is for the optimal value 'x' of cyclic shift.

Figure 8:
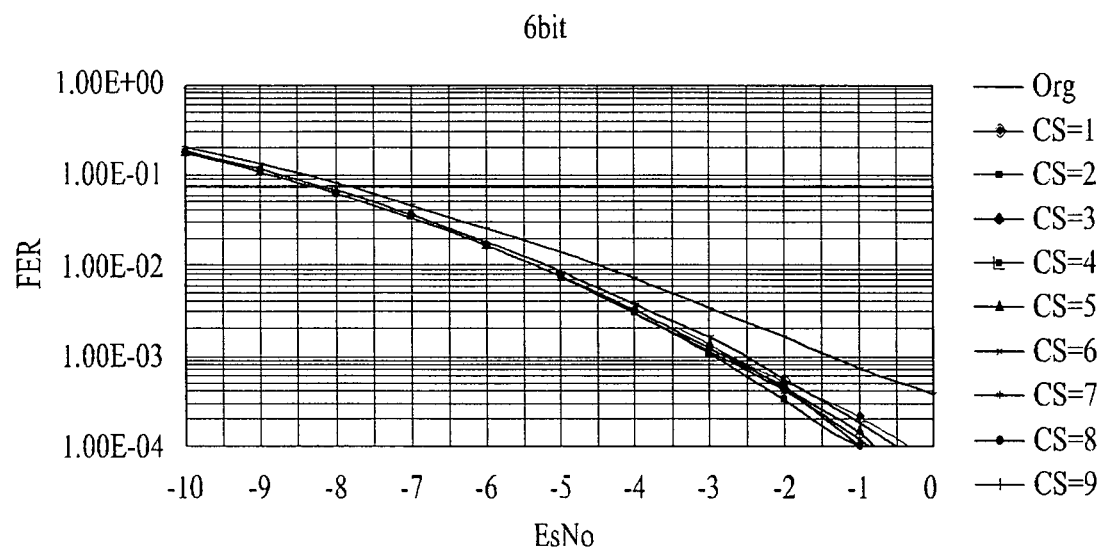
FIGS. 8 and 9 show a simulation result showing performance based on the values of cyclic shift when the number of input bits is 6 bits.
Figure 9:
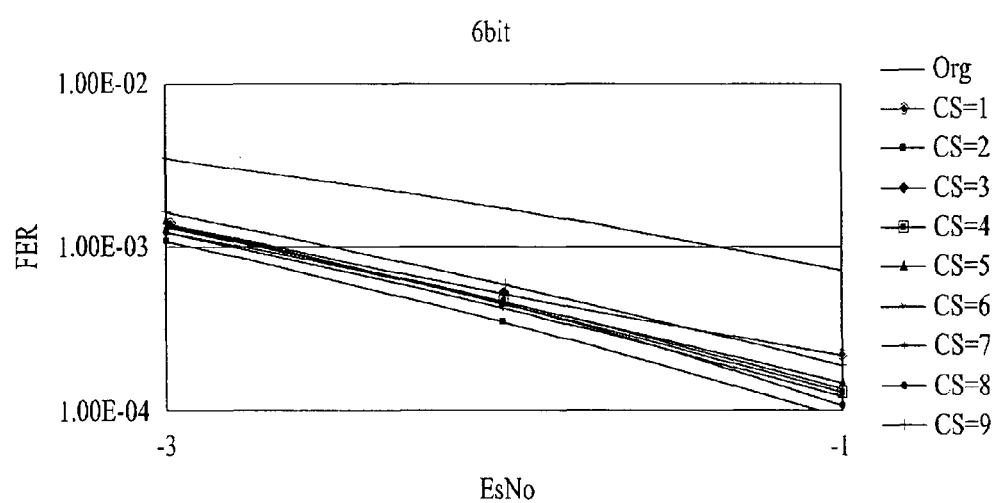

FIGS. 8 and 9 show a simulation result showing performance based on the values of cyclic shift when the number of input bits is 6 bits.

In FIGS. 8 and 9, "Org" indicate the case when no cyclic shift is applied. And, each of the curves are for the cases when cyclic shift values of 1, 2, . . . , 9 are applied to the basis sequences as the value of 'x' in equation 4. FIG. 9 largely displays the curves specifically within the rage from −3 to −1 of EsNo in FIG. 8. As can be seen in FIGS. 8 and 9, we can find that the curve for the cyclic shift value of '2' shows the best performance.

Figure 10:
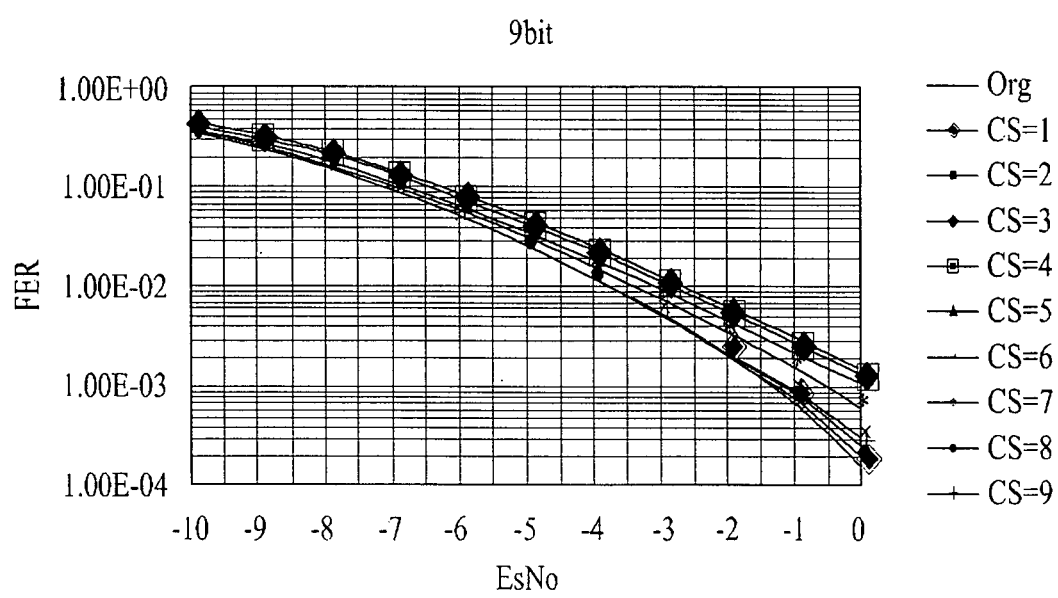
FIGS. 10 and 11 show a simulation result showing performance based on the values of cyclic shift when the number of input bits is 9 bits.
Figure 11:
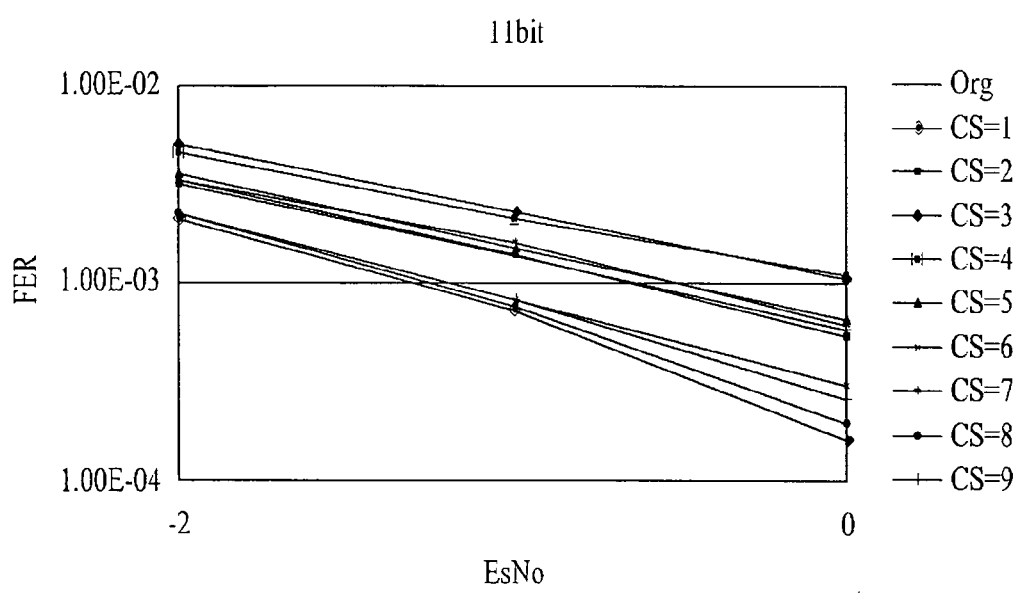

FIGS. 10 and 11 show a simulation result showing performance based on the values of cyclic shift when the number of input bits is 9 bits.

In FIGS. 10 and 11, "Org" indicate the case when no cyclic shift is applied. And, each of the curves are for the cases when cyclic shift values of 1, 2, . . . , 9 are applied to the basis sequences as the value of 'x' in equation 4. FIG. 11 largely displays the curves specifically within the rage from −3 to −1 of EsNo in FIG. 10. As can be seen in FIGS. 10 and 11, we can find that curve for the cyclic shift value of '1' shows the best performance.

Figure 12:
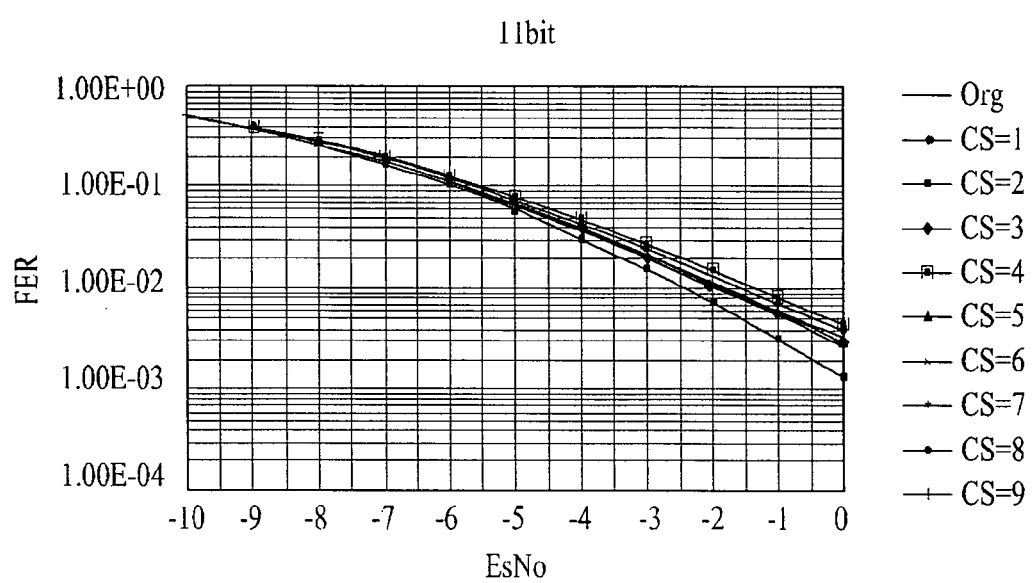
FIGS. 12 and 13 show a simulation result showing performance based on the values of cyclic shift when the number of input bits is 11 bits.
Figure 13:
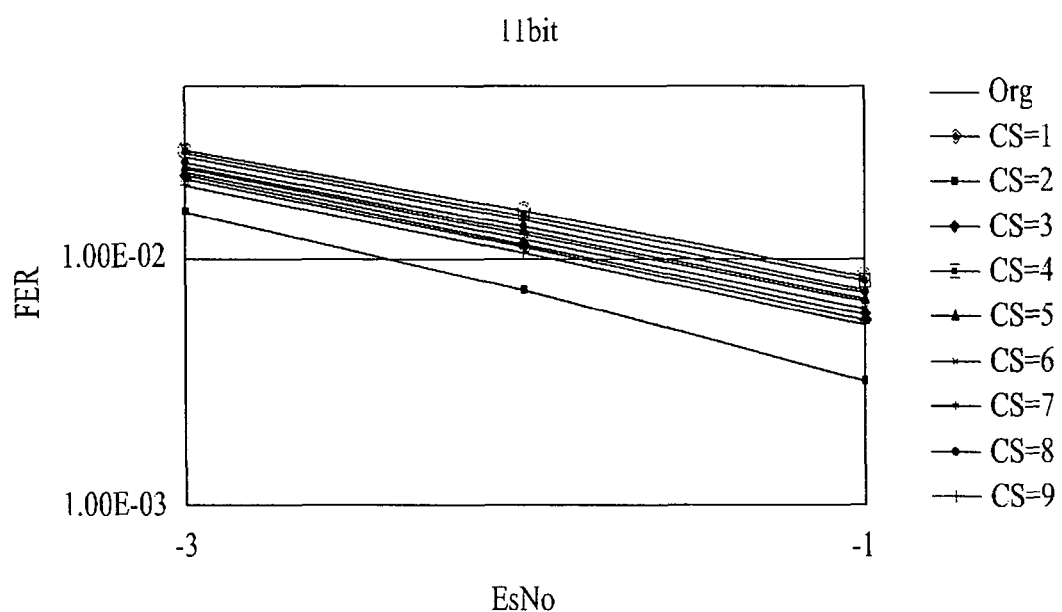

FIGS. 12 and 13 show a simulation result showing performance based on the values of cyclic shift when the number of input bits is 11 bits.

In FIGS. 12 and 13, "Org" indicate the case when no cyclic shift is applied. And, each of the curves are for the cases when cyclic shift values of 1, 2, . . . , 9 are applied to the basis sequences as the value of 'x' in equation 4. FIG. 13 largely displays the curves specifically within the rage from −3 to −1 of EsNo in FIG. 12. As can be seen in FIGS. 12 and 13, we can find that curve for the cyclic shift value of '2' shows the best performance. Particularly, we can find that the performance gain when applying the cyclic shift value of '2' is greater than any other cases (approximately 1 dB gain at FER=10⁻²).

In summary, one embodiment of the present invention can apply the optimized cyclic shift values for each of the input bit length. Another embodiment of the present invention proposes using a predetermined cyclic shift value optimized for the groups of the input bit lengths. Specifically, this embodiment focuses on the fact that the performance gain when the cyclic shift value of '2' is applied for the input bit length of 11 bits. Thus, one embodiment of the present invention proposes using the cyclic shift value predetermined as '2' for the input bit length of '11', while the cyclic shift value selected as a predetermined value among 1~9 for the input bit lengths other than 11 bit. This embodiment can be implemented as following:

$$b_i = \left(\sum_{n=0}^{A-1} (a_n \cdot M_{(i+C_A) \mod B, n})\right) \mod 2 \quad \text{[Equation 5]}$$

where i=0, 1, 2, ..., B-1. and $C_{A \neq 11}=k$, $C_{11}=2$

Still another embodiment of the present invention proposes using only the cyclic shift value of '2' regardless of the input bit length. It is because the performance gain acquired when the cyclic shift value of 2 exceeds those of other cases as stated above, and it is the simplest way to prevent the above mentioned problem. This embodiment can be implemented as following:

$$b_i = \left(\sum_{n=0}^{A-1} (a_n \cdot M_{(i+2) \mod B, n})\right) \mod 2 \quad \text{[Equation 6]}$$

where i=0, 1, 2, ..., B-1.

It is apparent for those skilled in the art that the method using the optimized cyclic shift is equivalent to a method using the optimized row-permutated basis sequence table of Table 1.

The above explanations are for the examples of applying cyclic shift to the basis sequences to address the problem mentioned with regards to linear block code of LTE Rel-8.

However, as mentioned before, we can address that problem by applying cyclic shift to the encoded bits before resource mapping. The cyclic shift value applied to the encoded bits ($b_i$) can be optimized as explained with regards to the embodiments applying the cyclic shift to the basis sequences. That is, the cyclic shift value to be applied to the encoded bits ($b_i$) can be predetermined based on the input bit length. And, the cyclic shift value to be applied to the encoded bits ($b_i$) can be predetermined as '2' for the input bit length of 11 bits, while the cyclic shift value to be applied to the encoded bits ($b_i$) can be selected among 1~9 for the input bit length other than 11 bits. Further, the cyclic shift value to be applied to the encoded bits ($b_i$) can be predetermined as '2' regardless of the input bit length.

Similarly, another embodiment of the present invention can use output sequence interleaving to solve the problem mentioned with regards to linear block code of LTE Rel-8. Specifically, the encoded bits having the odd number indexes (1, 3, 5, 7, ..., 19) are mapped to the first time-frequency resource region shown in FIG. 6, while the encoded bits having the even number indexes (0, 2, 4, 6, 8, ..., 18) are mapped to the second time-frequency resource shown in FIG. 6. By this encoded bit interleaving, the '0's and '1's of Mi, 5 of Table 1 can be spread into two time-frequency resource regions.

Another aspect of the present invention is directed to a column permutation of Table 1. This can be equivalent to the interleaving on the input bits to the encoder.

As stated above, the problem of the linear block coding for PUCCH by LTE Rel-8 is due to the use of Mi,5 of Table 1. Thus, performance degradation is observed since the input bit length exceeds 5 bit (since the basis sequence of Mi,5 of Table 1 is used). Therefore, one embodiment of the present invention proposes moving the Mi,5 of Table 1 to the right-most column so that the performance degradation is not happened until the input bit length is less than 13 bit.

TABLE 4

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 1 | 1 | 0 | 0 |
| 1 | 1 | 1 | 1 | 0 | 0 | 0 | 0 | 0 | 1 | 1 | 1 | 0 | 0 |
| 2 | 1 | 0 | 0 | 1 | 0 | 1 | 0 | 1 | 1 | 1 | 1 | 1 | 0 |
| 3 | 1 | 0 | 1 | 1 | 0 | 0 | 0 | 1 | 0 | 1 | 1 | 1 | 0 |
| 4 | 1 | 1 | 1 | 1 | 0 | 0 | 1 | 0 | 0 | 1 | 1 | 1 | 0 |
| 5 | 1 | 1 | 0 | 0 | 1 | 1 | 1 | 1 | 0 | 1 | 1 | 1 | 0 |
| 6 | 1 | 0 | 1 | 0 | 1 | 1 | 0 | 1 | 1 | 1 | 1 | 1 | 0 |
| 7 | 1 | 0 | 0 | 1 | 1 | 0 | 1 | 1 | 0 | 1 | 1 | 1 | 0 |
| 8 | 1 | 1 | 0 | 1 | 1 | 0 | 1 | 0 | 1 | 1 | 1 | 1 | 0 |
| 9 | 1 | 0 | 1 | 1 | 1 | 1 | 0 | 0 | 1 | 1 | 1 | 1 | 0 |
| 10 | 1 | 0 | 1 | 0 | 0 | 1 | 1 | 0 | 1 | 1 | 1 | 1 | 1 |
| 11 | 1 | 1 | 1 | 0 | 0 | 1 | 0 | 1 | 0 | 1 | 1 | 1 | 1 |
| 12 | 1 | 0 | 0 | 1 | 0 | 0 | 1 | 1 | 1 | 1 | 1 | 1 | 1 |
| 13 | 1 | 1 | 0 | 1 | 0 | 0 | 1 | 0 | 1 | 1 | 1 | 1 | 1 |
| 14 | 1 | 0 | 0 | 0 | 1 | 0 | 1 | 0 | 0 | 1 | 0 | 1 | 1 |
| 15 | 1 | 1 | 0 | 0 | 1 | 1 | 1 | 0 | 1 | 1 | 0 | 1 | 1 |
| 16 | 1 | 1 | 1 | 0 | 1 | 1 | 0 | 0 | 1 | 0 | 1 | 1 | 1 |
| 17 | 1 | 0 | 0 | 1 | 1 | 0 | 0 | 1 | 0 | 0 | 1 | 1 | 1 |
| 18 | 1 | 1 | 0 | 1 | 1 | 1 | 1 | 0 | 0 | 0 | 0 | 0 | 1 |
| 19 | 1 | 0 | 0 | 0 | 0 | 1 | 0 | 0 | 0 | 0 | 0 | 0 | 1 |

By using Table 4 instead of Table 1, the unbalanced weight distribution problem does not happen for the case when the input bit length is less than 13 bits. This embodiment is equivalent to applying interleaving the input bits to the encoder. That is, to achieve the same effect as using Table 4, indexes (n') of the interleaved input signal ($a_{n'}$) can be expressed using indexes (n) of the input signal ($a_n$) as:

n'=n, for n=0, 1, 2, 3, 4,
n'=n−1, for n=6, 7, 8, . . . , 13,
n'=n+8, for n=5.

On the other hand, if we look close into Table 1, we can find that $11^{th}$, $12^{th}$, and $13^{th}$ basis sequence in Table 1 has 16 '1's and 4 '0's. It is because that the Hamming Distance until the $10^{th}$ basis sequence is '10', while that for the $11^{th}$, $12^{th}$, and $13^{th}$ basis sequences are '4'. Thus, using $11^{th}$, $12^{th}$, and $13^{th}$ basis sequences can depredates the Hamming Distance property. Based on this, one embodiment of the present invention proposes moving M1, 5 of Table 1 to $10^{th}$ column so that the positions of the $11^{th}$, $12^{th}$, and $13^{th}$ basis sequences are unchanged. Table 5 shows the basis sequence table according to the present embodiment.

TABLE 5

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 1 | 0 | 1 | 1 | 0 | 1 | 1 | 1 |
| 3 | 1 | 0 | 1 | 1 | 0 | 0 | 0 | 1 | 0 | 0 | 1 | 1 | 1 |
| 4 | 1 | 1 | 1 | 1 | 0 | 0 | 1 | 0 | 0 | 0 | 1 | 1 | 1 |
| 5 | 1 | 1 | 0 | 0 | 1 | 1 | 1 | 1 | 0 | 0 | 1 | 1 | 1 |
| 6 | 1 | 0 | 1 | 0 | 1 | 1 | 0 | 1 | 1 | 0 | 1 | 1 | 1 |
| 7 | 1 | 0 | 0 | 1 | 1 | 0 | 1 | 1 | 0 | 0 | 1 | 1 | 1 |
| 8 | 1 | 1 | 0 | 1 | 1 | 0 | 1 | 0 | 1 | 0 | 1 | 1 | 1 |
| 9 | 1 | 0 | 1 | 1 | 1 | 1 | 0 | 0 | 1 | 0 | 1 | 1 | 1 |
| 10 | 1 | 0 | 1 | 0 | 0 | 1 | 1 | 0 | 1 | 1 | 1 | 1 | 1 |
| 11 | 1 | 1 | 1 | 0 | 0 | 1 | 0 | 1 | 0 | 1 | 1 | 1 | 1 |
| 12 | 1 | 0 | 0 | 1 | 0 | 0 | 1 | 1 | 1 | 1 | 1 | 1 | 1 |
| 13 | 1 | 1 | 0 | 1 | 0 | 1 | 0 | 1 | 1 | 1 | 1 | 1 | 1 |
| 14 | 1 | 0 | 0 | 0 | 1 | 0 | 1 | 0 | 1 | 1 | 0 | 1 | 1 |
| 15 | 1 | 1 | 0 | 0 | 1 | 1 | 1 | 0 | 1 | 1 | 1 | 0 | 1 |
| 16 | 1 | 1 | 1 | 0 | 1 | 1 | 0 | 0 | 1 | 1 | 0 | 1 | 1 |
| 17 | 1 | 0 | 0 | 1 | 1 | 0 | 0 | 1 | 0 | 1 | 0 | 1 | 1 |
| 18 | 1 | 1 | 0 | 1 | 1 | 1 | 1 | 0 | 0 | 1 | 0 | 0 | 0 |
| 19 | 1 | 0 | 0 | 0 | 0 | 1 | 0 | 0 | 0 | 1 | 0 | 0 | 0 |

By using Table 5 instead of Table 1, the unbalanced weight distribution problem does not happen for the case when the input bit length is less than 9 bits. Further, performance degradation by using the $11^{th}$, $12^{th}$, and $13^{th}$ basis sequences is the same as in LTE Rel-8.

This embodiment is equivalent to applying interleaving the input bits to the encoder. That is, to achieve the same effect as using Table 5, indexes (n') of the interleaved input signal ($a_{n'}$) can be expressed using indexes (n) of the input signal ($a_n$) as:

n'=n, for n=0, 1, 2, 3, 4, 10, 11, 12
n'=n−1, for n=6, 7, 8, 9,
n'=n+4, for n=5.

The above explained column permutation (input bit interleaving) can be applied together with the cyclic shift to the rows (cyclic shift to the basis sequence or encoded bits). By using the column permutation (input bit interleaving), the problem caused by Mi. 5 of Table 1 does not happen for the short length input bits, while by applying cyclic shift to the rows (cyclic shift to the basis sequence or encoded bits) the unbalanced weight distribution can be avoided.

Hereinafter, apparatuses for the present invention are explained.

Figure 14:
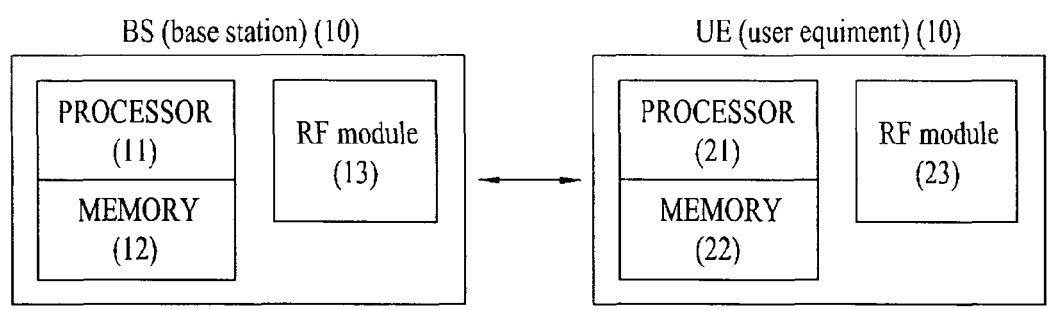
FIG. 14 shows system for implementing the present invention.

FIG. 14 shows system for implementing the present invention.

In FIG. 14, a wireless communication system includes a BS 10 and one or more UE 20. In downlink, a transmitter may be a part of the BS 10, and a receiver may be a part of the UE 20. In uplink, a transmitter may be a part of the UE 20, and a receiver may be a part of the BS 10. A BS 10 may include a processor 11, a memory 12, and a radio frequency (RF) unit 13. The processor 11 may be configured to implement proposed procedures and/or methods described in this application. The memory 12 is coupled with the processor 11 and stores a variety of information to operate the processor 11. The RF unit 13 is coupled with the processor 11 and transmits and/or receives a radio signal. A UE 20 may include a processor 21, a memory 22, and a RF unit 23. The processor 21 may be configured to implement proposed procedures and/or methods described in this application. The memory 22 is coupled with the processor 21 and stores a variety of information to operate the processor 21. The RF unit 23 is coupled with the processor 21 and transmits and/or receives a radio signal. The BS 10 and/or the UE 20 may have single antenna and multiple antennas. When at least one of the BS 10 and the UE 20 has multiple antennas, the wireless communication system may be called as multiple input multiple output (MIMO) system.

The above mentioned methods are directed to uplink signal transmission, thus the user equipment (UE) for these methods are further explained.

Figure 15:
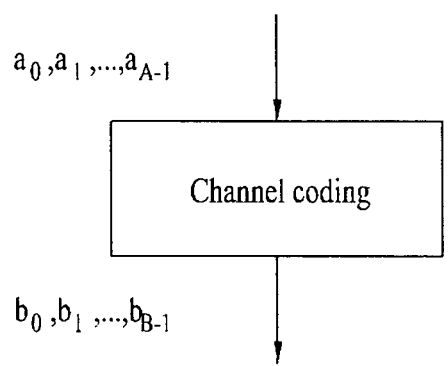
FIG. 15 shows the encoder of UE according to one embodiment of the present invention.

The processor (21) of the UE may comprise channel coding module or encoder as shown in FIG. 15.

FIG. 15 shows the encoder of UE according to one embodiment of the present invention.

Encoder of UE may configured for encoding an input signal ($a_0, a_1, \ldots, a_{A-1}$) by using 'A' basis sequences having a length of 'B' bits to output an encoded signal ($b_0, b_1, \ldots, b_{B-1}$). In this embodiment, 'B' can be set as '20' and 'A' can be set as a natural number less than 14.

In LTE-advanced system, spatial multiplexing of up to four layers is considered for the uplink transmission. In the uplink single user spatial multiplexing, up to two transport blocks can be transmitted from a scheduled terminal in a subframe per uplink component carrier. Depending on the number of transmission layers, the modulation symbols associated with each of the transport blocks are mapped onto one or two layers according to the same principle as in Rel-8 LTE downlink spatial multiplexing. Moreover, DFT-precoded OFDM is adopted as the multiple access scheme for uplink data transmission both in absence and presence of spatial multiplexing. In case of multiple component carriers, there is one DFT per component carrier. In LTE-advanced, in particular, both frequency-contiguous and frequency-non-contiguous resource allocation is supported on each component carrier.

Figure 16:
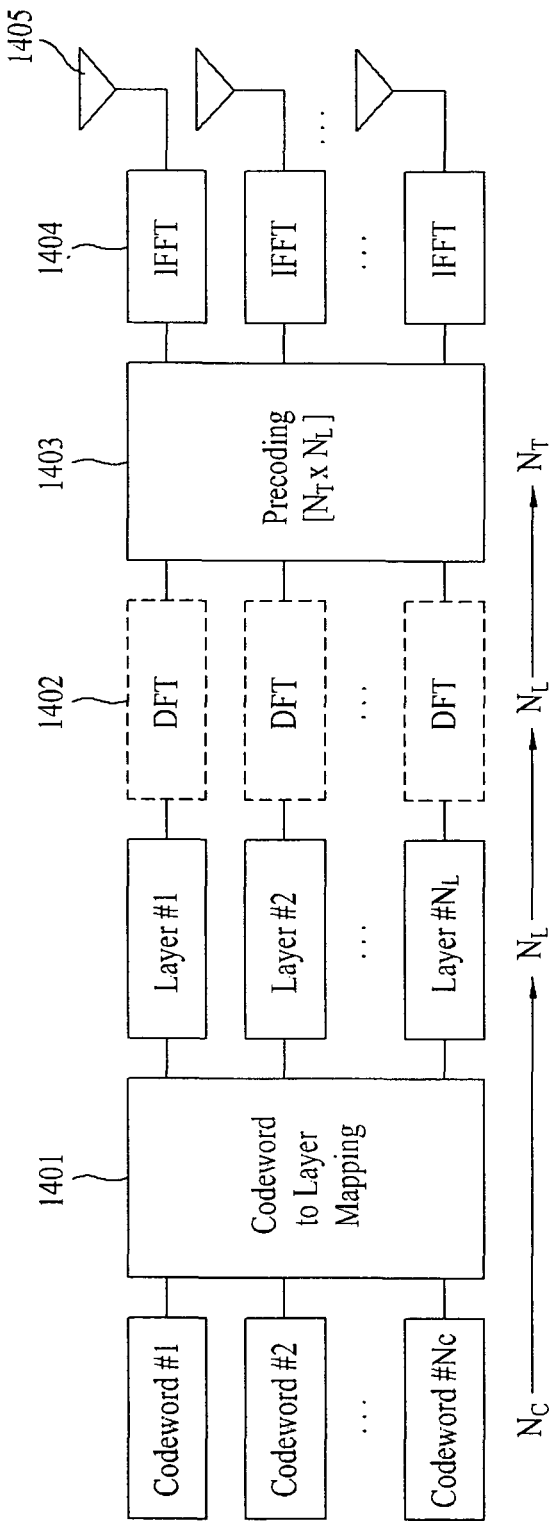
FIG. 16 depicts an example of data signal mapping relation for a MIMO system by a processor of the UE based on the SC-FDMA transmission.

FIG. 16 depicts an example of data signal mapping relation for a MIMO system by a processor of the UE based on the SC-FDMA transmission.

Each of the encoded bits ($b_0, b_1, \ldots, b_{B-1}$) from encoder of UE can constitutes each of the codewords shown in FIG. 16. So if the number of codewords was $N_C$, and the number of layers is $N_L$, $N_C$ number of information symbols or multiples of $N_C$ number of information symbols will be mapped to $N_L$ number of symbols or multiples of $N_L$. DFT transform precoding by DFT module of the processor for SC-FDMA does not change the size of the layer. When precoding is performed to layers, the number of information symbols will change from $N_L$ to $N_T$, by the $N_T$ by $N_L$ matrix multiplication. Generally the transmission 'rank' of the spatially multiplexed data is equal to number of layers conveying data in a given transmission instant ($N_L$ in the example).

The locations of DFT modules and precoding module can be changed according to implementation of the processor of the UE.

The precoded symbols can be mapped to the time-frequency resources by resource mapper (not shown in FIG. 16) of the UE when MIMO scheme is applied. For the normal operation, the resource mapper of the UE may be configured for mapping the encoded signal having the length of 20 bits to two different resource regions, where the first 10 bits of the encoded signal are mapped to a first resource region, and the second 10 bits of the encoded signal are mapped to a second resource region, as shown in FIG. 6. And, a transmitter of UE transmits the resource-mapped signals to a Node B.

As stated above, the encoded signal or the basis sequences can be cyclic shifted with a value of (x) at the encoder, wherein (x) is a natural number less than 20. When this is implemented by using the newly designed basis sequence table, this table may be stored in the memory (22) of UE. And, this can be implemented as the encoder of the UE encode the input bits using equation 4 with the value of 'x' stored in the memory (22) of the UE, still using the Table 1 also stored in the memory (22) of the UE.

Although the embodiments of the present invention have been disclosed in view of each aspect of the invention, those skilled in the art will appreciate that embodiments of each aspect of the invention can be incorporated. And, there can be advantages not explicitly discussed, since they are obvious from the description for those skilled in the art.

The invention claimed is:

1. A method of transmitting signals by a user equipment (UE), the method comprising:

encoding an input signal having a length of (A) bits by using (A) basis sequences to output an encoded signal, wherein (A) is a non-zero natural number;

mapping the encoded signal to two different resource regions, wherein the first half of the encoded signal is mapped to a first resource region, and the second half of the encoded signal is mapped to a second resource region; and transmitting the resource-mapped signals to a Node B, wherein the encoded signal or the (A) basis sequences are cyclic shifted with a value of (x) before mapping the encoded signal to the two different resource regions such that the first or the second half of the encoded signals are not encoded with all '0's, wherein (x) is a natural number predetermined based on the length of (A) bits.

2. The method of claim 1, wherein each of (A) basis sequences has a length of 20 bits, (A) is less than 14, and the encoded signal has a length of 20 bits, and wherein the input signal is expressed as ($a_n$), where n=0, 1, ..., A−1, the n'th basis sequence is expressed as ($M_{i,n}$), where i=0, 1, ..., 19, and the encoded signal, ($b_i$), is expressed as:

$$b_i = \left( \sum_{n=0}^{A-1} (a_n \cdot M_{(i+x) \bmod 20, n}) \right) \bmod 2,$$

where i=0, 1, ... 19.

3. The method of claim 1, wherein the value of (x) for A=11 is predetermined as 2, and the values of (x) for A≠11 are predetermined among 1~19.

4. The method of claim 1, further comprising:
interleaving the input signal having the length of (A) bits before encoding the input signal.

5. The method of claim 4, wherein indexes (n') of the interleaved input signal ($a_{n'}$) is expressed using indexes (n) of the input signal ($a_n$) as:
n'=n, for n =0, 1, 2, 3, 4,
n'=n−1, for n=6, 7, 8, ..., 13,
n'=n+8, for n=5.

6. The method of claim 4, wherein indexes (n') of the interleaved input signal ($a_{n'}$) is expressed using indexes (n) of the input signal ($a_n$) as:
n'=n, for n =0, 1, 2, 3, 4, 10, 11, 12
n'=n−1, for n=6, 7, 8, 9,
n'=n+4, for n=5.

7. The method of claim 1, wherein the (A) basis sequences are selected from 13 basis sequences expressed as:

| I | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 1 | 0 | 1 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 0 | 0 | 1 | 0 | 1 | 1 | 1 |
| 17 | 1 | 0 | 0 | 1 | 1 | 1 | 0 | 0 | 1 | 0 | 0 | 1 | 1 |

-continued

| I | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 | wherein ($M_{i,n}$) is the n'th basis sequence, where i=0, 1, ..., 19, and where n=0, 1, ..., A−1.

8. A user equipment (UE) for transmitting signals, the UE comprising:
- an encoder configured for encoding an input signal having a length of (A) bits by using (A) basis sequences to output an encoded signal wherein (A) is a non-zero natural number;
- a resource mapper configured for mapping the encoded signal to two different resource regions, wherein the first half of the encoded signal is mapped to a first resource region, and the second half of the encoded signal is mapped to a second resource region; and
- a transmitter configured for transmitting the resource-mapped signals to a Node B,
- wherein the encoded signal or the (A) basis sequences are cyclic shifted with a value of (x) at the encoder such that the first or the second half of the encoded signals are not encoded with all '0's, wherein (x) is a natural number predetermined based on the length of (A) bits.

9. The UE of claim 8, wherein each of (A) basis sequences has a length of 20 bits, (A) is less than 14, and the encoded signal has a length of 20 bits, and
wherein the input signal is expressed as ($a_n$), where n=0, 1, ..., A−1, the n'th basis sequence is expressed as ($M_{i,n}$), where i=0, 1, ..., 19, and the encoded signal, ($b_i$), is expressed as:

$$b_i = \left( \sum_{n=0}^{A-1} (a_n \cdot M_{(i+x)\bmod 20, n}) \right) \bmod 2,$$

where i=0, 1, ... 19.

10. The UE of claim 8, wherein the value of (x) for A=11 is predetermined as 2, and the values of (x) for A≠11 are predetermined among 1~19.

11. The UE of claim 8, wherein the encoder is further configured for interleaving the input signal having the length of (A) bits before encoding the input signal.

12. The UE of claim 11, wherein indexes (n') of the interleaved input signal ($a_{n'}$) is expressed using indexes (n) of the input signal ($a_n$) as:
n'=n, for n=0, 1, 2, 3, 4,
n'=n−1, for n=6, 7, 8, ..., 13,
n'=n+8, for n=5.

13. The UE of claim 11, wherein indexes (n') of the interleaved input signal ($a_{n'}$) is expressed using indexes (n) of the input signal ($a_n$) as:
n'=n, for n=0, 1, 2, 3, 4, 10, 11, 12
n'=n−1, for n=6, 7, 8, 9,
n'=n+4, for n=5.

14. The UE of claim 8, wherein the (A) basis sequences are selected from 13 basis sequences expressed as:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 0 | 1 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 | wherein ($M_{i,n}$) is the n'th basis sequence, where i=0, 1, ..., 19, and where n=0, 1, ..., A−1.

\* \* \* \* \*